(12) United States Patent
Kawakita

(10) Patent No.: US 7,795,689 B2
(45) Date of Patent: Sep. 14, 2010

(54) SEMICONDUCTOR DEVICE INCLUDING A GERMANIUM SILICIDE FILM ON A SELECTIVE EPITAXIAL LAYER

(75) Inventor: Keizo Kawakita, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 124 days.

(21) Appl. No.: 11/878,294

(22) Filed: Jul. 23, 2007

(65) Prior Publication Data

US 2008/0023772 A1 Jan. 31, 2008

(30) Foreign Application Priority Data

Jul. 25, 2006 (JP) .............................. 2006-202143

(51) Int. Cl.
H01L 21/8238 (2006.01)
H01L 29/43 (2006.01)

(52) U.S. Cl. ............... 257/369; 257/384; 257/E29.139; 257/E29.039; 257/E21.634; 438/199

(58) Field of Classification Search ............. 257/369, 257/382, 383, 384, E27.046, E27.026, E27.014, 257/E23.157, E21.634, 213, 288, 774, E29.139, 257/E29.039, E21.632; 438/199, 620, 655, 438/664, 682, 197, 275, 299, 300
See application file for complete search history.

(56) References Cited

U.S. PATENT DOCUMENTS

| | | | |
|---|---|---|---|
| 6,281,059 B1 * | 8/2001 | Cheng et al. ............... | 438/200 |
| 7,372,099 B2 * | 5/2008 | Yasutake .................... | 257/327 |
| 2004/0142567 A1 * | 7/2004 | Nakajima et al. .......... | 438/689 |
| 2005/0275018 A1 * | 12/2005 | Venkatesan et al. ........ | 257/347 |
| 2006/0131662 A1 * | 6/2006 | Yamada et al. ............. | 257/374 |
| 2007/0161170 A1 * | 7/2007 | Orlowski et al. ........... | 438/197 |

FOREIGN PATENT DOCUMENTS

| | | |
|---|---|---|
| JP | 3-34571 | 2/1991 |
| JP | 4-225568 | 8/1992 |
| JP | 5-183160 | 7/1993 |
| JP | 05183160 A * | 7/1993 |
| JP | 7-69446 | 3/1995 |
| JP | 2005-302914 | 10/2005 |

OTHER PUBLICATIONS

Article: Chidambaram, et al., "35% Drive Current Improvement from Recessed-SiGe Drain Extensions on 37nm Gate Lengths PMOS", in 2004 Symposium on VLSI Technology Digest of Technical Papers, P48-49 (p. 2, Line 22 to p. 3, Line 1 in the specification).

Article: Eneman, et al., "Layout Impact on the Performance of a Locally Strained PMOSFET", in 2005 Symposium on VLSI Technology Digest of Technical Papers, P22-23 (p. 3, Lines 2-4 in the specification).

Japanese Office Action dated Oct. 16, 2008 with Partial English-Language Translation.

* cited by examiner

*Primary Examiner*—Victor A Mandala
*Assistant Examiner*—Scott Stowe
(74) *Attorney, Agent, or Firm*—McGinn IP Law Group, PLLC

(57) ABSTRACT

A process for manufacturing a semiconductor device includes: forming first contact holes in a dielectric film for a PMOS transistor; depositing germanium on the source/drain regions of the PMOS transistor exposed from the first contact holes; heat treating the germanium with silicon in the source/drain regions of the PMOS transistor to form a germanium silicide film; forming second contact holes in the dielectric film for the source/drain regions of the NMOS transistor; and forming contact plugs in the first and second contact holes.

20 Claims, 14 Drawing Sheets

SEMICONDUCTOR DEVICE INCLUDING A GERMANIUM SILICIDE FILM ON A SELECTIVE EPITAXIAL LAYER

This application is based upon and claims the benefit of priority from Japanese patent application No. 2006-202143, the disclosure of which is incorporated herein in its entirety by reference.

BACKGROUND OF THE INVENTION (a) Field of the Invention

The present invention relates to a semiconductor device and a method for manufacturing the same and, more particularly, to the structure of source/drain regions of a MOSFET in the semiconductor device.

(b) Description of the Related Art

A DRAM device generally includes a memory cell area including a plurality of memory cells arranged in a matrix, and a peripheral circuit area in which a peripheral circuit for driving the memory cells are disposed. In recent DRAM devices, MOS transistors include a selective epitaxial silicon layer as the contact layer for the source/drain regions of the MOS transistors in the memory cell area (refer to Patent Publication JP-1995-69446A, for example).

In the semiconductor device described in the above publication, after forming MOS transistors on a semiconductor substrate, an insulating film, and a bottom electrode layer of cell capacitors are formed thereon. Contact holes are then formed penetrating the bottom electrode layer and the insulating layer to expose the source/drain regions. A silicon layer is then deposited using a selective epitaxial growth technique on the surface of the bottom electrode layer and within the contact holes, whereby a contact layer connecting together the source/drain regions and the bottom electrode layer is formed.

In a conventional DRAM device having a 6F2 cell structure, the above epitaxial contact layer is effective to reduce the contact resistance of the memory cells in the memory cell area. However, the epitaxial contact layer is also formed on the source/drain regions of the MOS transistors of the peripheral circuit area. The epitaxial contact layer formed on the source/drain regions of PMOS transistors in the peripheral circuit area may reduce the ON-current (Ion) of the PMOS transistors due to the resistance component of the epitaxial contact layer.

In the conventional DRAM device, the epitaxial contact layer is generally made of titanium silicide (TiSi), and formed on the $P^+$-diffused regions and $N^+$-diffused regions of the MOSFETs. In the mean time, as described in a literature entitled "35% Drive Current Improvement from Recessed-SiGe Drain Extensions on 37 nm Gate Length PMOS", in 2004 Symposium on VLSI Technology Digest of Technical Papers, P48-49, and "Layout Impact on the Performance of a Locally Strained PMOSFET", in 2005 Symposium on VLSI Technology Digest of Technical Papers, P22-23, use of a germanium silicide (SiGe) layer is proposed for improving the ON-current of a PMOS transistor. The SiGe layer is embedded in a recess formed on the $P^+$-type source/drain regions of the PMOS transistor to reduce the compressed strain in the gate electrode of the PMOS transistor and the vicinity thereof in the source/drain regions.

In the proposed structure, however, the process for manufacturing the semiconductor device uses an additional photolithographic step for forming the recess on the surface of the $P^+$-type source/drain regions of the PMOS transistors for receiving the SiGe epitaxial layer. The additional photolithographic step reduces through-put of the semiconductor device and thus increases the costs thereof.

SUMMARY OF THE INVENTION

In view of the above, it is an object of the present invention to provide a method for manufacturing a semiconductor device including the SiGe layer on the source/drain regions of a PMOSFET, which is capable of forming the SiGe layer without using an additional photolithographic step.

It is another object of the present invention to provide a semiconductor device including the SiGe layer formed by a process without using an additional photolithographic step.

The present invention provides a semiconductor device including: a silicon substrate; a PMOS transistor formed on the silicon substrate; a dielectric film formed on the PMOS transistor and including therein a first contact hole penetrating the dielectric film to reach a source/drain region of the PMOS transistor; a germanium silicide film formed in the first contact hole and having a bottom in contact with the source/drain region of the PMOS transistor; and a first contact plug connecting to the germanium silicide film in the first contact hole.

The present invention also provides a method for manufacturing a semiconductor device including: forming a PMOS transistor and an NMOS transistor each including a source/drain region; forming a dielectric film covering the PMOS transistor and the NMOS transistor; forming a first contact hole penetrating the dielectric film to reach the source/drain region of the PMOS transistor; depositing germanium on the source/drain region of the PMOS transistor exposed from the first contact hole; heat treating the deposited germanium to react with silicon in the source/drain region of the PMOS transistor and thereby form a germanium silicide film; and forming a first contact plug connecting to the germanium silicide film within the first contact hole.

The above and other objects, features and advantages of the present invention will be more apparent from the following description, referring to the accompanying drawings.

PREFERRED EMBODIMENTS OF THE INVENTION

Figure 1:
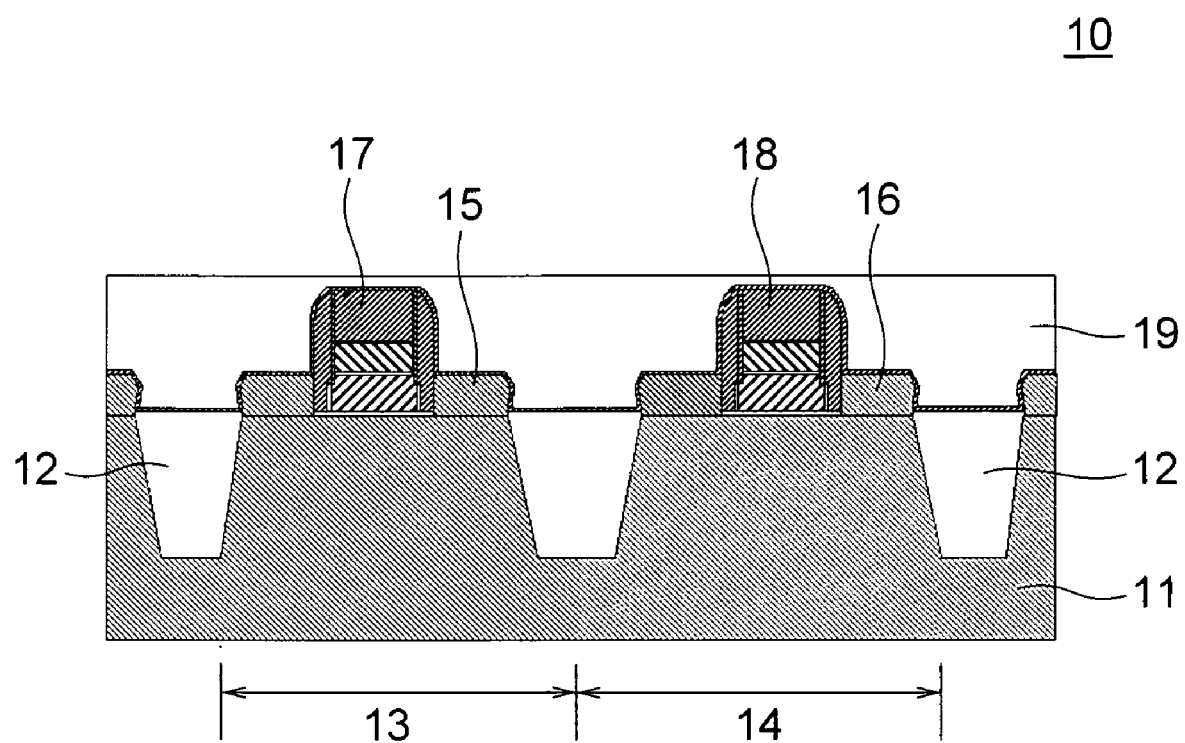
FIGS. 1 to 11 are sectional views of a semiconductor device in consecutive steps of a process for manufacturing the same according to a first embodiment of the present invention.

Now, exemplary embodiments of the present invention will be described with reference to accompanying drawings,

First Embodiment

FIGS. 1 to 11 are sectional views of a semiconductor device in consecutive steps of a process for manufacturing the same according to a first embodiment of the present invention. These figures show only the peripheral circuit area of a DRAM device. The structure of the NMOS transistors in the memory cell area is similar to the NMOS transistor shown in these drawings. First, using a known semiconductor fabrication process, PMOS transistors including PMOS gate electrodes 17 and associated source/drain regions and NMOS transistors including NMOS gate electrodes 18 and associated source/drain regions are formed on a silicon substrate 11. The silicon substrate 11 is isolated by an element isolation structure 12 into PMOS regions 13 for receiving therein the PMOS transistors and NMOS regions 14 for receiving therein the NMOS transistors.

A contact layer including $P^+$-diffused contact regions 15 and $N^+$-diffused contact regions 16 is formed on the silicon substrate 11, wherein the $P^+$-diffused contact regions 15 are formed in the PMOS regions 13 and the $N^+$-diffused contact regions 16 are formed in the NMOS regions 14. It is to be noted that the PMOS transistors are formed only in the peripheral circuit area, and the NMOS transistors are formed in the peripheral circuit area and memory circuit area. Thereafter, an interlayer dielectric film 19 is deposited on those MOS transistors (FIG. 1).

Figure 2:
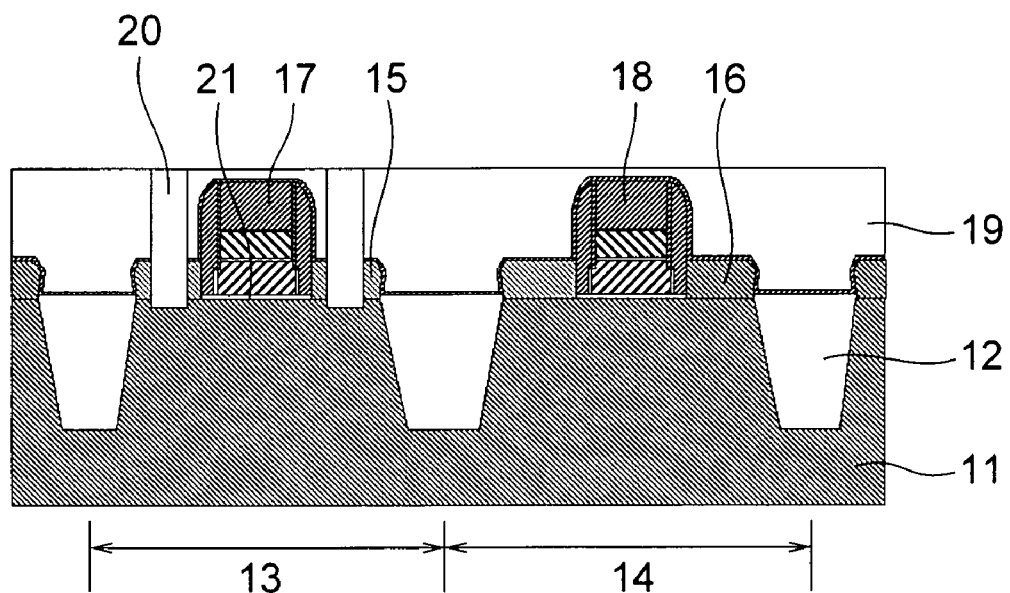
Figure 3:
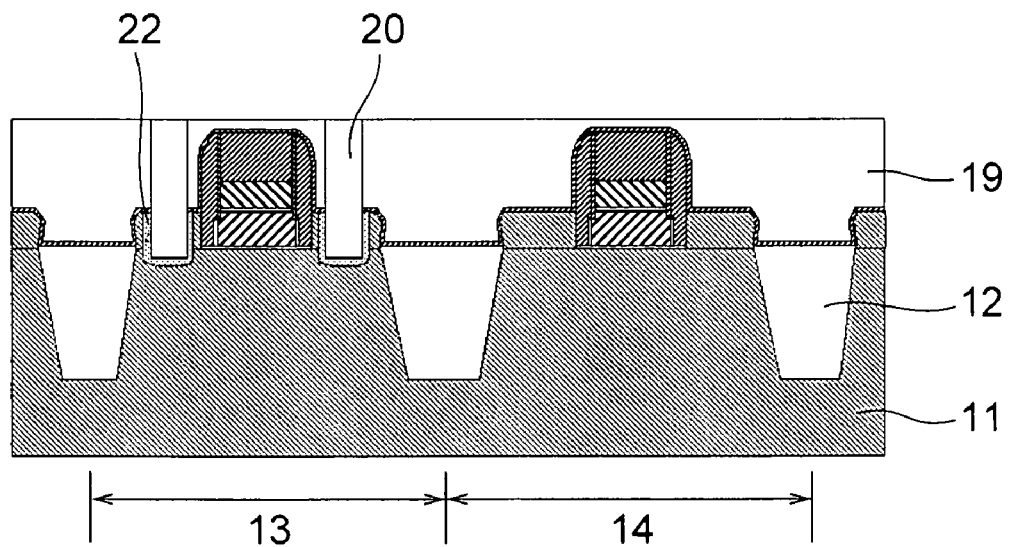

Subsequently, the contact layer and interlayer dielectric film 19 are patterned in the $P^+$-diffused regions 15 to form contact holes 20 therein. The contact holes 20 penetrate the interlevel dielectric film 19 and P+ diffused regions 15 of the contact layer to reach the internal of the silicon substrate 11, i.e., below the bottom of a gate oxide film 21 (FIG. 2). Boron (B) or boron fluoride ($BF_2$) is then implanted in the entire surface area of the silicon substrate without using a mask, to thereby form a boron-diffused layer 22 within the contact holes 20, for the purpose of reducing the contact resistance. The boron (or boron fluoride) is implanted in a direction 0 to 7 degrees inclined from the perpendicular of the silicon substrate 11, whereby a boron-implanted layer is formed on the bottom and sidewall of the contact holes 20, contacting the exposed surface of the $P^+$-diffused regions 15. Boron may be replaced by another element.

Figure 4:
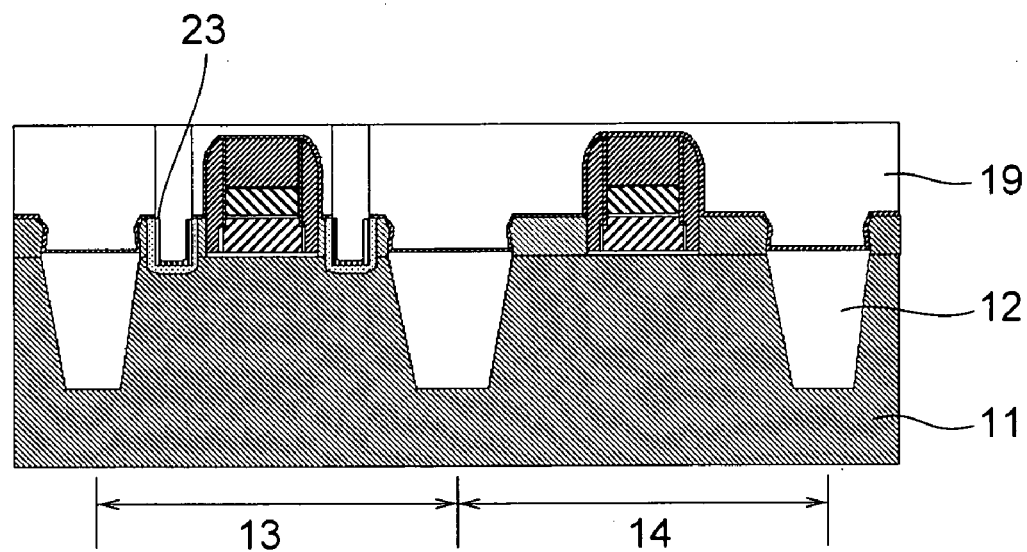
Figure 5:
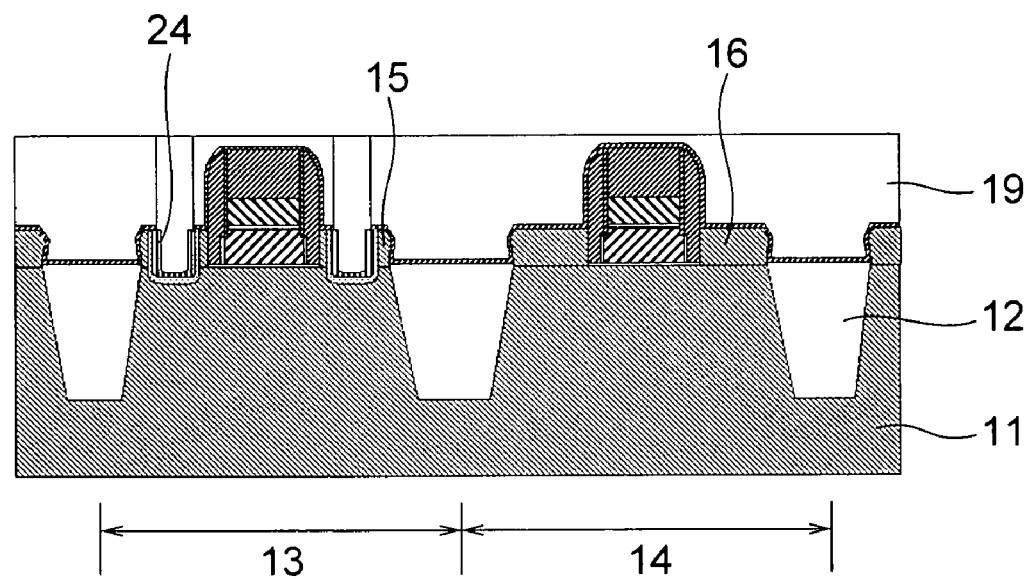
Figure 6:
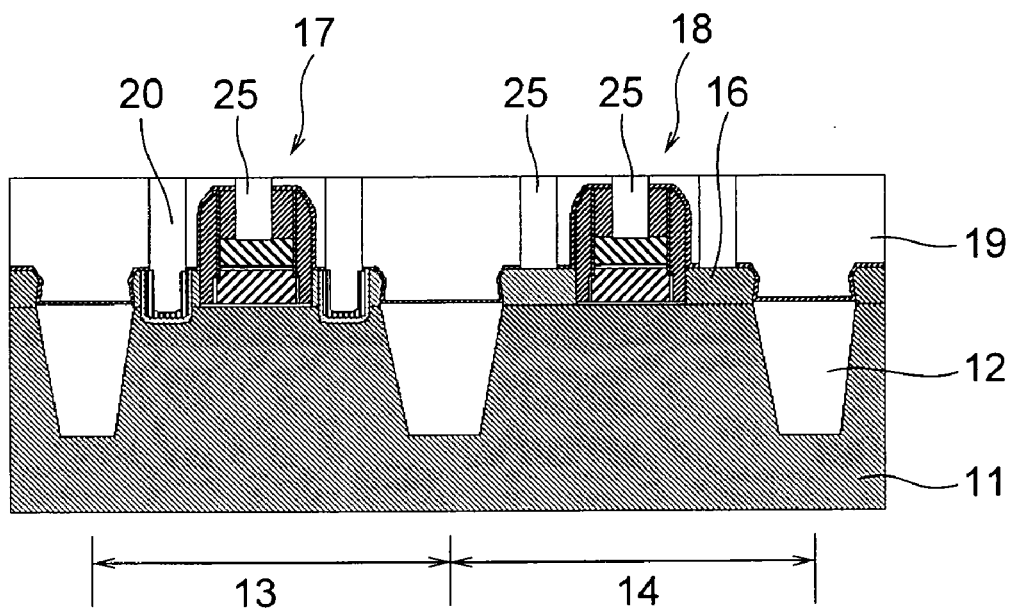
Figure 7:
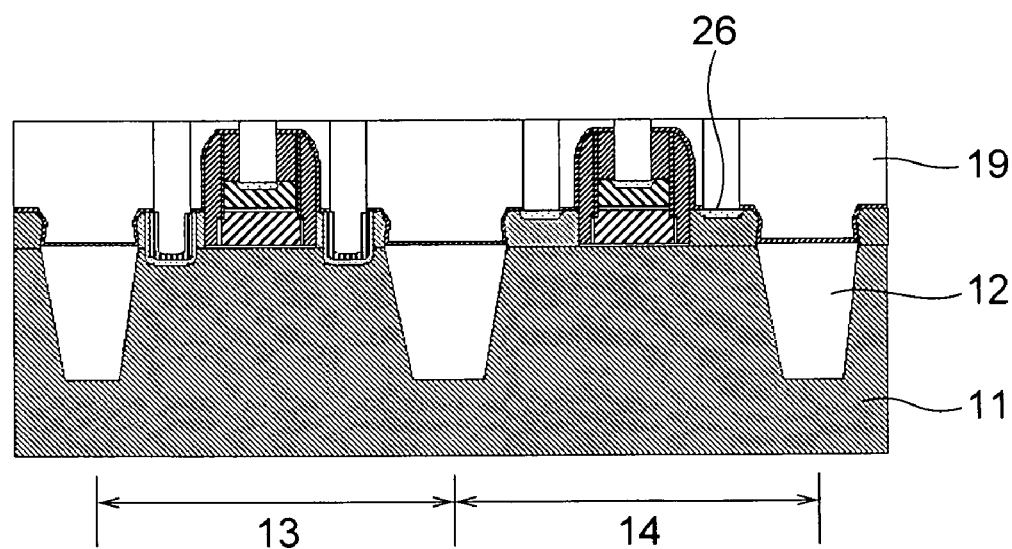

Subsequently, a CVD process is conducted using $GeH_4$ as source gas, to selectively deposit germanium on the bottom of the contact holes 20, to form a selective epitaxial germanium layer 23 (FIG. 4). Thereafter, a heat treatment is conducted to change the epitaxial germanium layer 23 at the bottom of the contact holes 20 and adjacent portion thereof into a SiGe layer 24 (FIG. 5). Thereafter, as shown in FIG. 6, another patterning process is performed to form contact holes 25 exposing therefrom the N+ diffused regions 16, PMOS gate electrodes 17 and NMOS gate electrodes 18. Thereafter, phosphor (P) is implanted into the entire surface, for the purpose of reducing the resistance of $N^+$-diffused regions to form phosphor-implanted $N^+$-layer 26 (FIG. 7).

Figure 8:
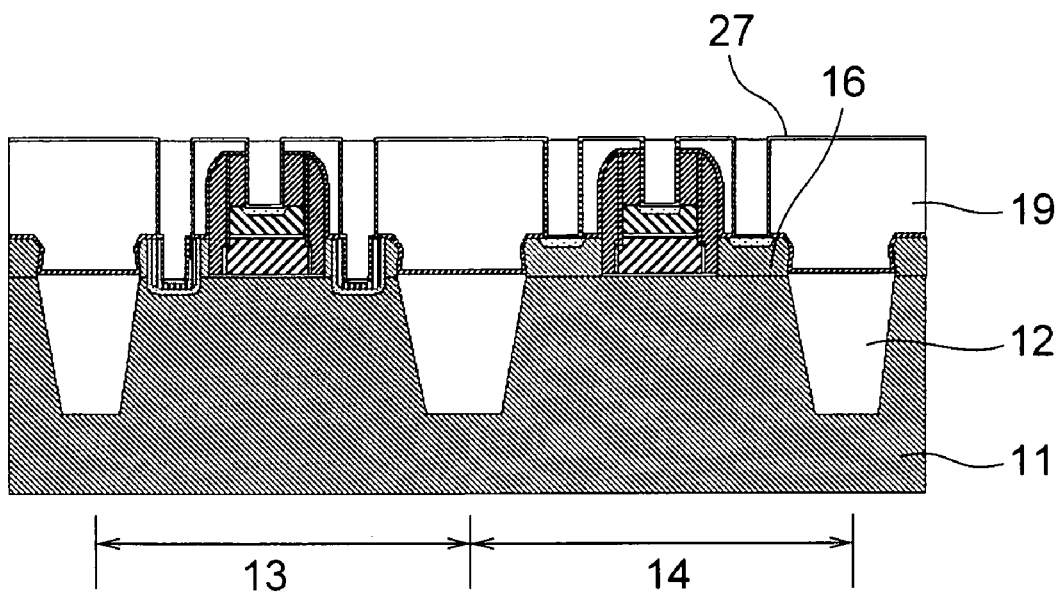
Figure 9:
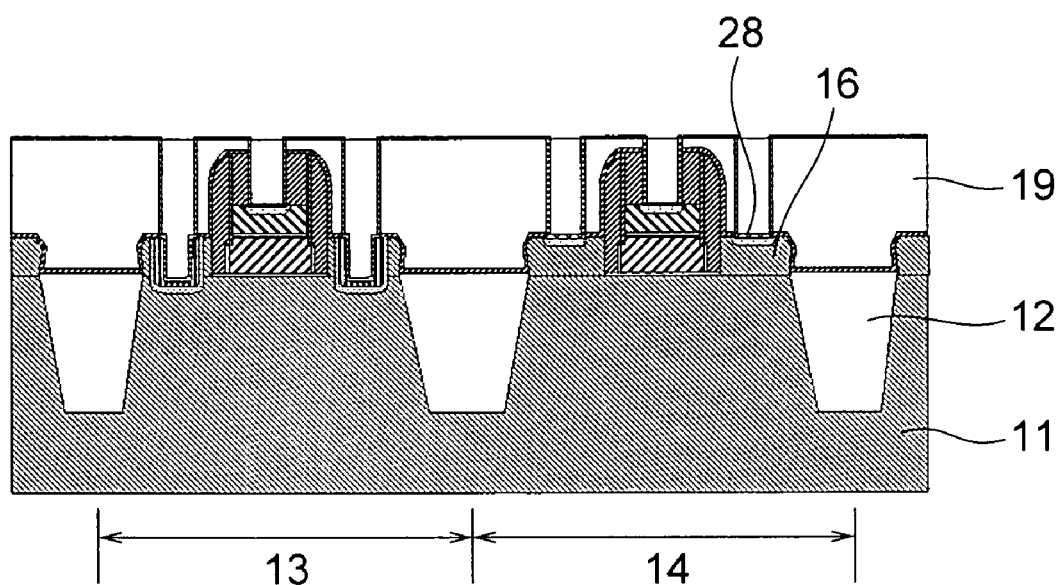

Subsequently, titanium (Ti) and titanium nitride (TiN) are consecutively deposited to form a Ti/TiN film 27 on the entire surface (FIG. 8). A heat treatment is then performed to react the Ti with silicon and thereby form a titanium silicide layer 28 on the $N^+$-diffused regions 16 (FIG. 9). In an alternative, the silicide layer 28 formed on the bottom of the contact holes 20 and 25 may be a nickel (Ni) silicide layer, or cobalt (Co) silicide layer by selecting the deposited metal.

Figure 10:
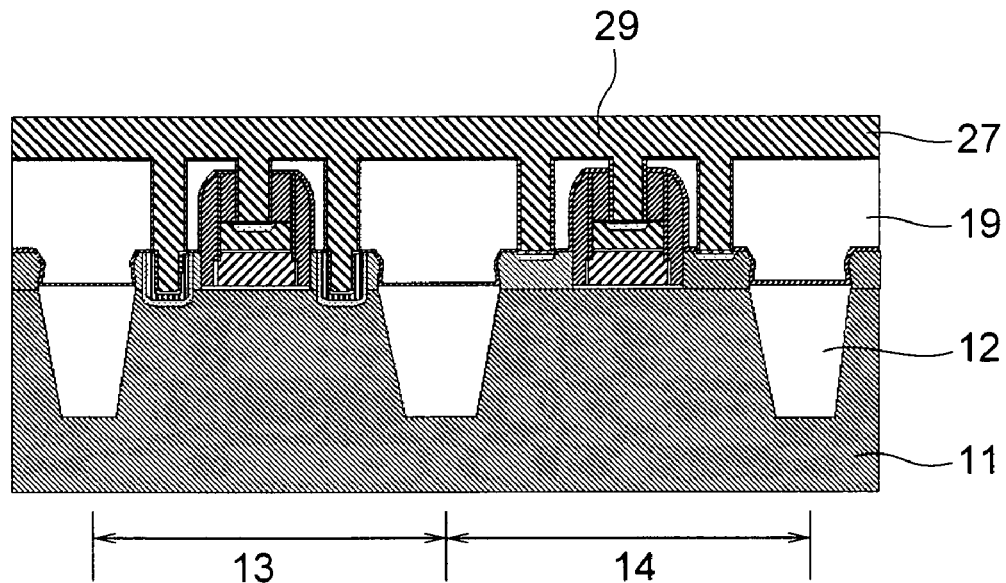
Figure 11:
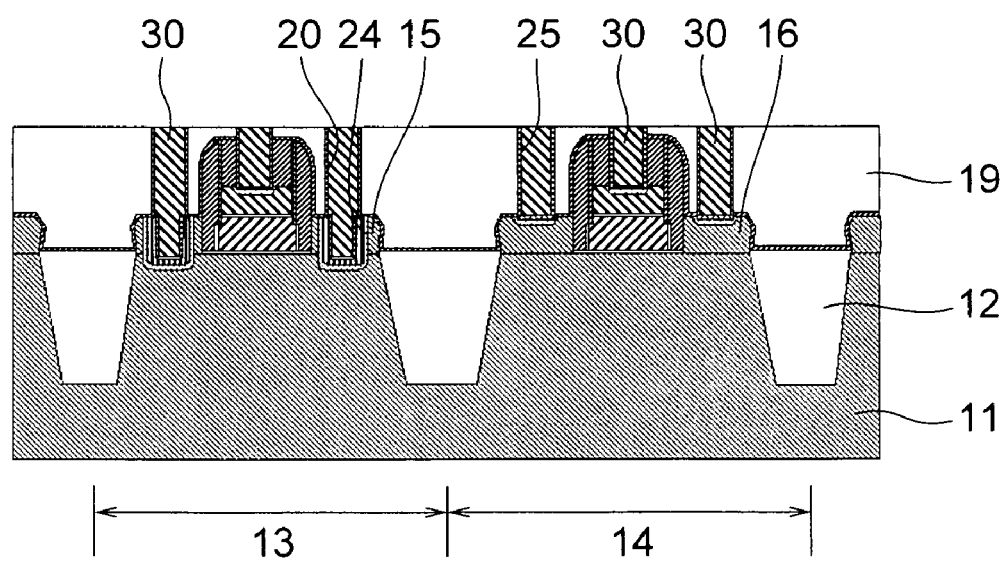

Subsequently, tungsten (W) is deposited using a CVD technique to form a W-CVD film 29 (FIG. 10). Thereafter, a CMP process is performed to remove a portion of the W-CVD film 29 and Ti/TiN film 27 on top of the interlayer dielectric film 19, to thereby leave a tungsten plug (W plug) 30 within the contact holes 20 and 25 (FIG. 11). Thus, PMOS transistors in the peripheral circuit area, NMOS transistors in the peripheral circuit area, and NMOS transistors in the memory cell area are completed in the DRAM device. Overlying structures in the DRAM device, such as capacitors and bit lines of the memory cells, are then formed using a known technique.

Figure 12:
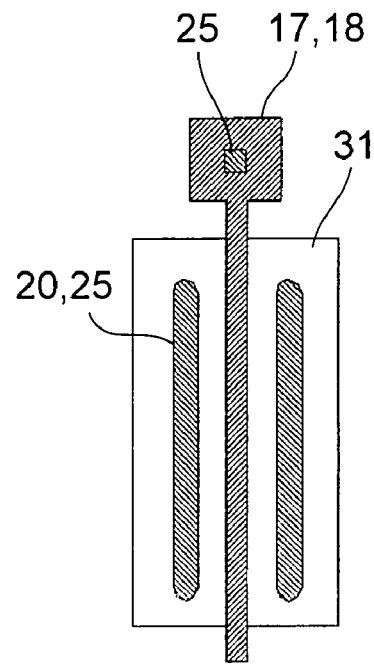
FIGS. 12 to 14 are top plan views of examples of the structure and location of the contact holes in a semiconductor device.

FIG. 12 shows an example of the layout structure of the contact holes 20, 25 formed by the above embodiment. As shown therein, the contact holes 20, 25 formed in the active area 31 (PMOS region or NMOS region) of the silicon substrate have an elliptical shape in cross section, extending parallel to the gate electrodes 17, 18, whereby the gate electrode 17, 18 and active region 31 in the vicinity thereof are applied with an efficient compressive stress from the contact holes 20, 25.

Figure 13:
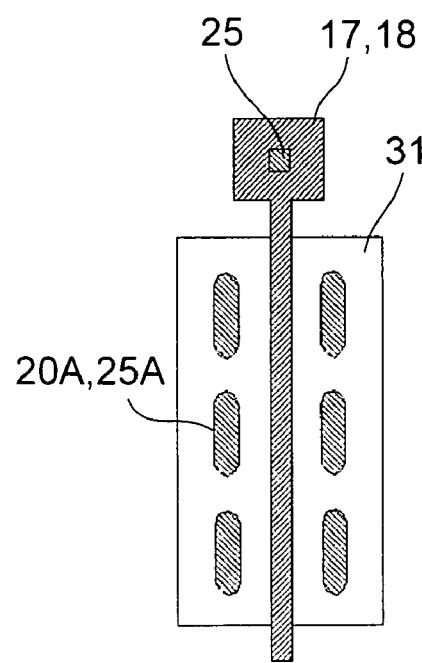

FIG. 13 shows another example, wherein the elliptical contact holes 20A, 25A are such that the elliptical contact holes 20, 25 of FIG. 12 are separated in the extending direction at a plurality of portions. By selecting a suitable length of the elongate (elliptical) contact holes 20A, 25A extending along the gate electrodes 17, 18, the compressive stress applied to the active region 31 can be adjusted in the vicinity of the gate electrodes 17, 18, whereby the ON-current of the PMOS transistors can be controlled.

Figure 14:
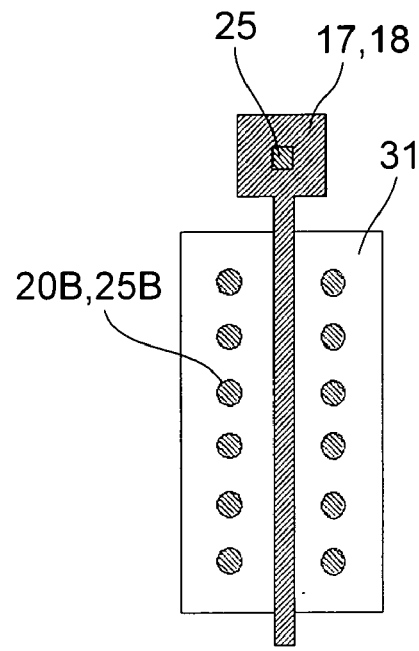
Figure 15:
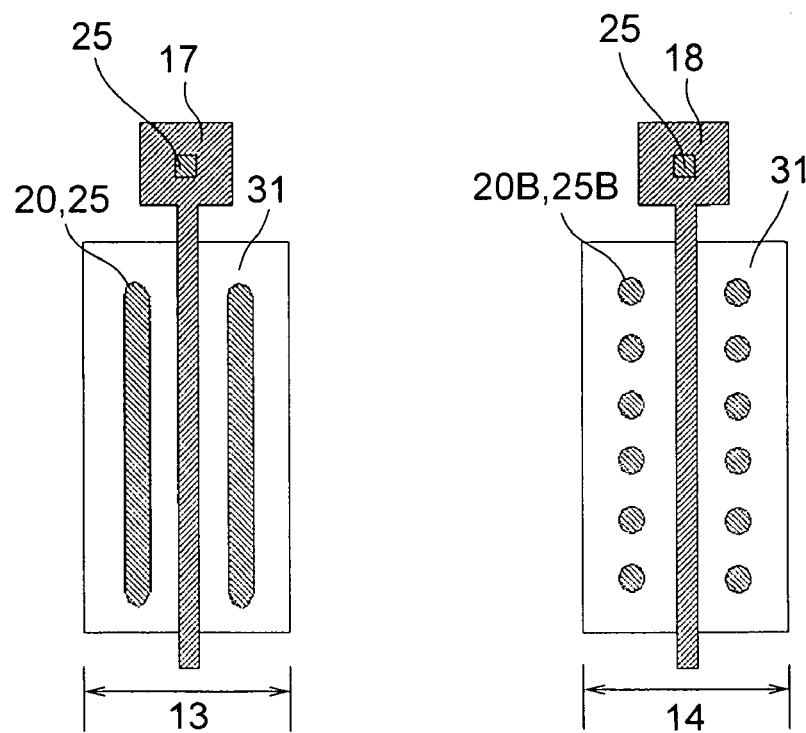
FIG. 15 is a top plan view of another example of the structure and location of the contact holes in a semiconductor device.
Figure 16:
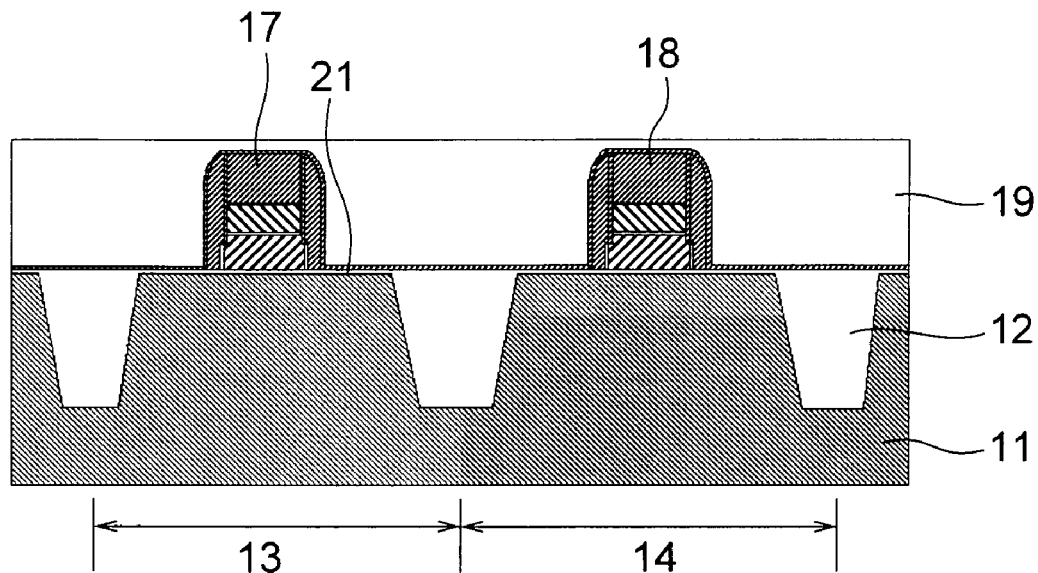
FIGS. 16 to 26 are sectional views of a semiconductor device in consecutive steps of a process for manufacturing the same according to a second embodiment of the present invention.

FIG. 14 shows another alternative of the layout structure of FIG. 12, showing a circular contact holes 20B, 25B, as viewed from the top. The number of circular contact holes 20B, 25B is selected to achieve a suitable compressive stress being applied to the gate electrodes 17, 18. Moreover, as shown in FIG. 15, the layout structure of FIG. 12 (FIG. 13) and the layout structure of FIG. 14 may be mixed in a single semiconductor device, wherein the elongate contact holes 20, 25 are provided in the PMOS area 13, and the circular contact holes 20B, 25B are provided in the NMOS area 14.

In the fabrication process of the above embodiment, the number of masks used in the photolithographic steps is two, and not increased from the conventional process even performing the step of forming the SiGe layer in the contact holes exposing therefrom the source/drain regions of the PMOS transistors. The SiGe layer 24 formed on the source/drain diffused regions of the PMOS transistors applies a compressive stress to the silicon substrate, thereby raising the ON-current of tghe PMOS transistors.

Second Embodiment

Figure 17:
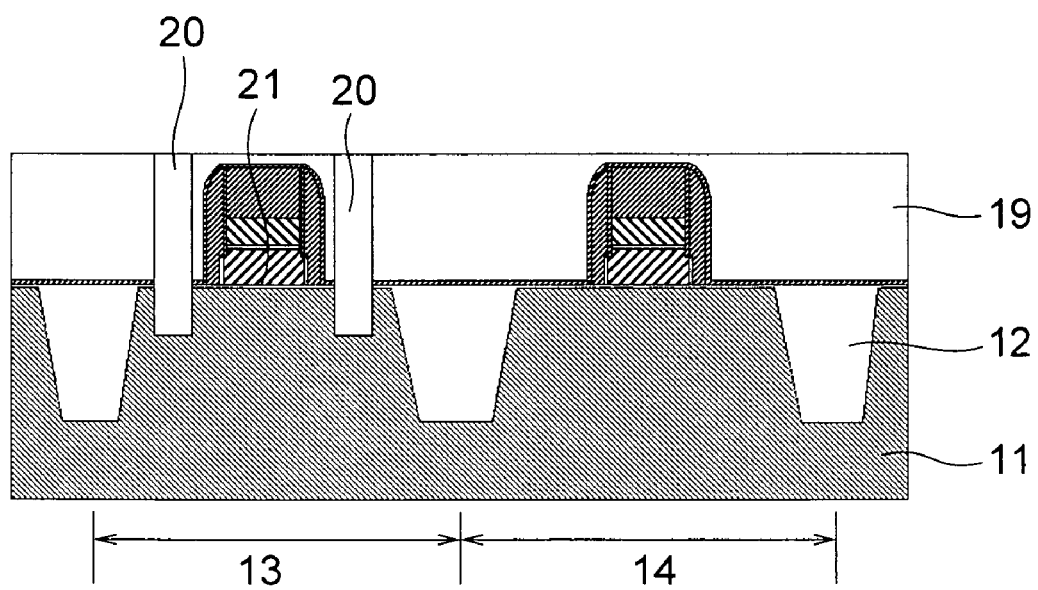

FIGS. 16 to 26 show sectional views of a semiconductor device in consecutive steps of a process for manufacturing the same according to a second embodiment of the present invention. First, a known semiconductor fabrication process is used for forming the structure of FIG. 16, wherein PMOS transistors and NMOS transistors underlying an interlevel dielectric film 19 are formed similarly to FIG. 1, except that the selective epitaxial contact layer shown in FIG. 1 is not formed in FIG. 16. Thereafter, using an ordinary patterning process to form contact holes 20 exposing therethrough source/drain regions of the PMOS regions 13 in the silicon substrate 11 (FIG. 17). At this stage, the bottom of the contact holes 20 is below the bottom of gate oxide film 21.

Figure 18:
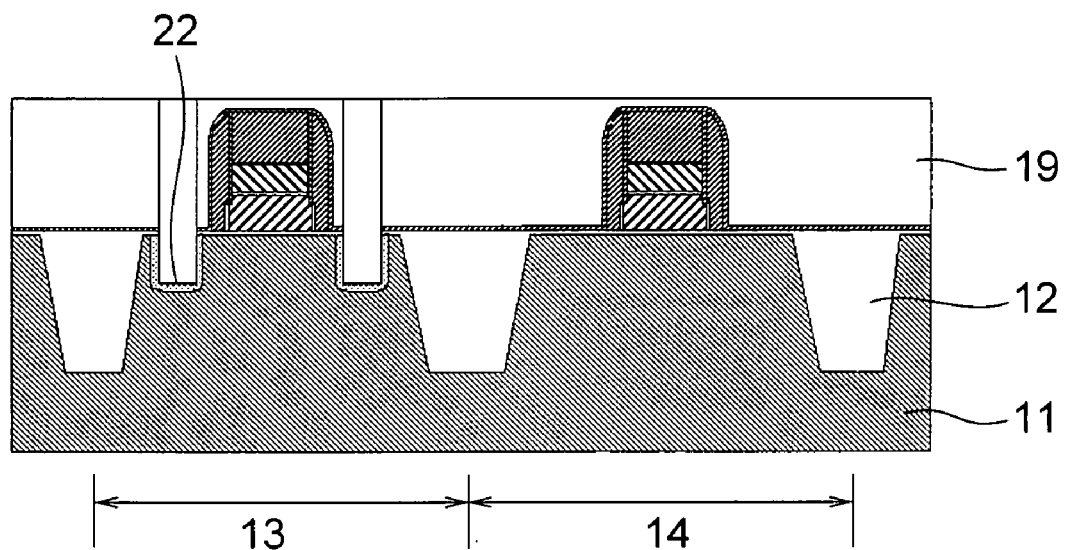
Figure 19:
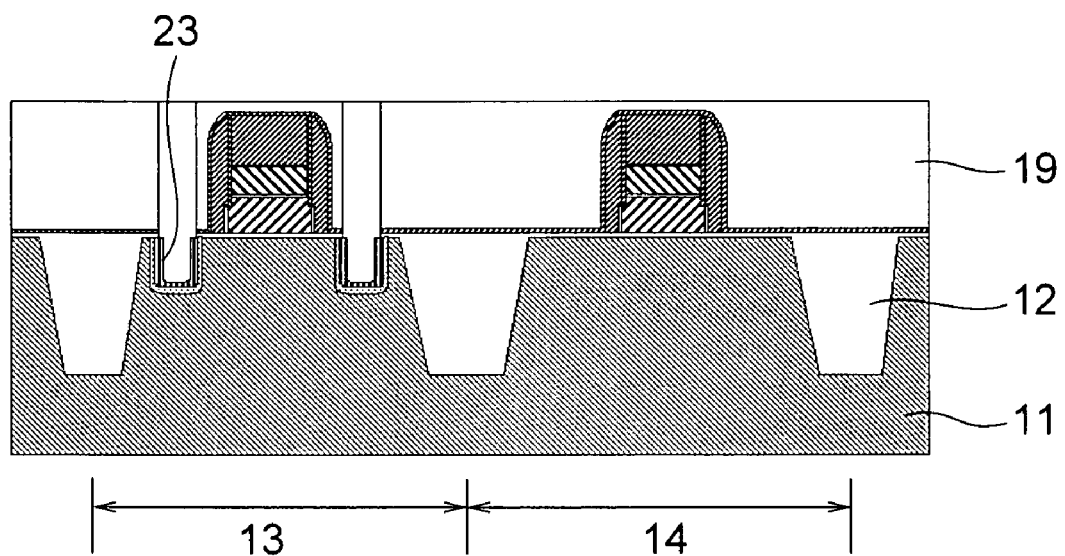
Figure 20:
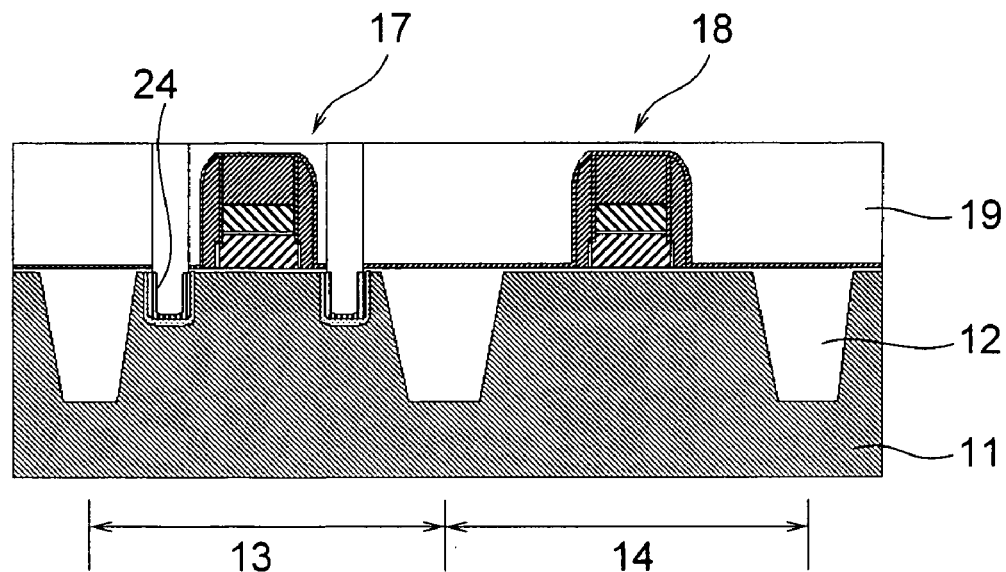

Subsequently, boron or boron fluoride is implanted into the entire surface area of the silicon substrate 11 without using a mask, for reducing the contact resistance (FIG. 18). The implantation angle for the boron (or boron fluoride) is inclined by 1 to 7 degrees with respect to the perpendicular to the substrate surface, thereby forming a boron-implanted layer on the bottom and sidewall of the contact holes. The implantation at this stage is not limited to an ion implantation. Thereafter, a selective CVD process using $GeH_4$ as source gas is conducted to form an epitaxial germanium layer 23 only on the bottom of the contact holes 20 and the vicinity thereof (FIG. 19). Thereafter, the germanium in the selective epitaxial germanium layer 23 is reacted with silicon by using a heat treatment, to thereby form a SiGe layer 24 on the bottom of the contact holes 20 and vicinity thereof (FIG. 20).

Figure 21:
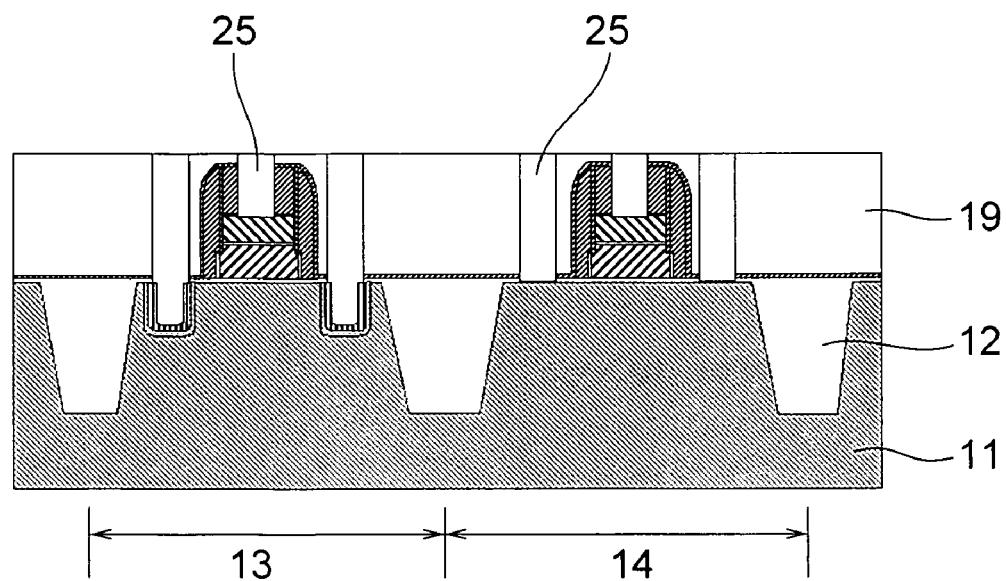
Figure 22:
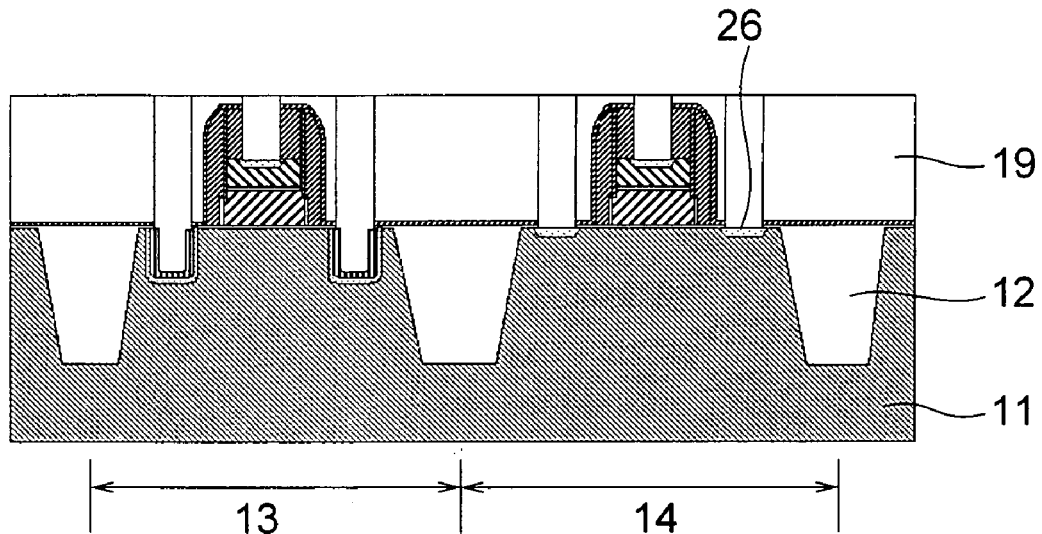
Figure 23:
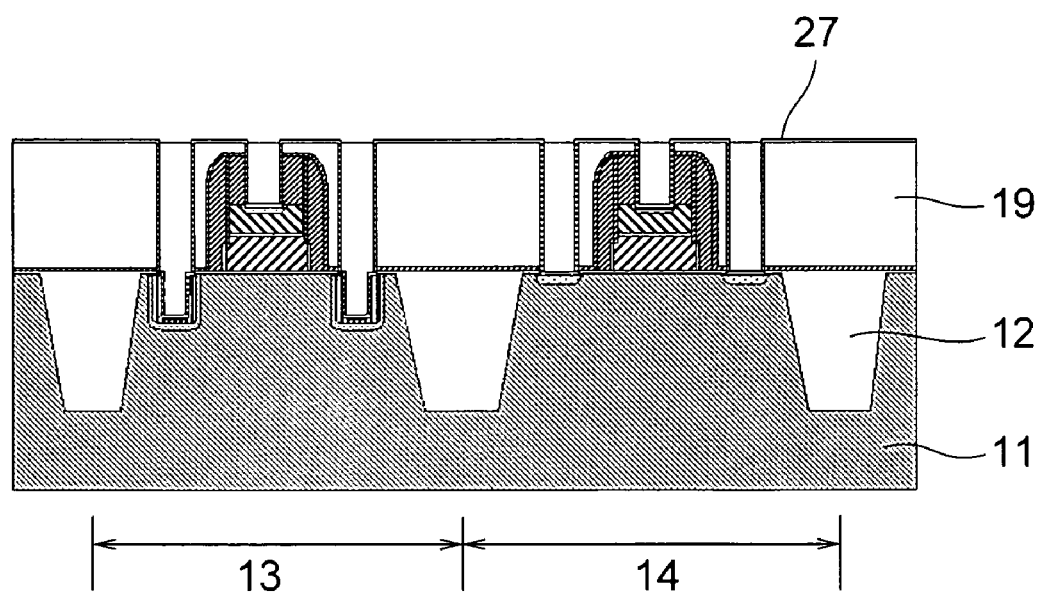
Figure 24:
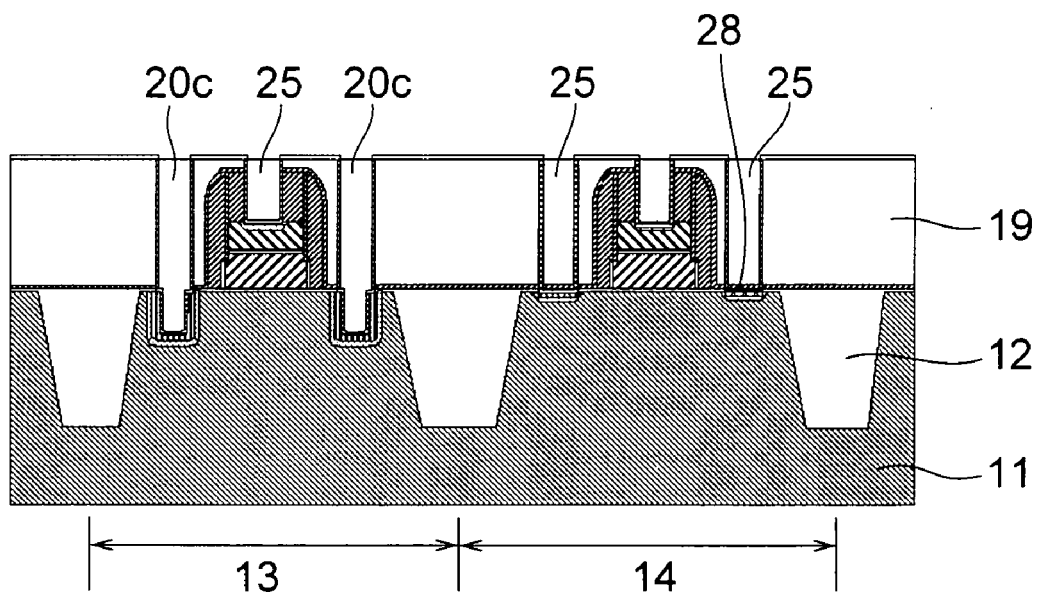

Subsequently, an ordinary dry etching process is used to form contact holes 25 exposing therethrough source/drain regions of the NOS regions 13 in the silicon substrate 11 and gate electrodes in the PMOS and NMOS regions (FIG. 21). Thereafter, phosphor (P) is implanted into the entire surface by using the interlevel dielectric film 19 as a mask to form phosphor-implanted layer 26, for reducing the N+ contact resistance (FIG. 22). Then, Ti and TiN are consecutively deposited to form a Ti/TiN film 27 (FIG. 23). A heat treatment is then performed to form a titanium silicide layer 28 on the N+ diffused regions (FIG. 24). The silicide layer formed on the bottom of the contact holes 25 may be a nickel (Ni) silicide or cobalt Co) silicide layer instead.

Figure 25:
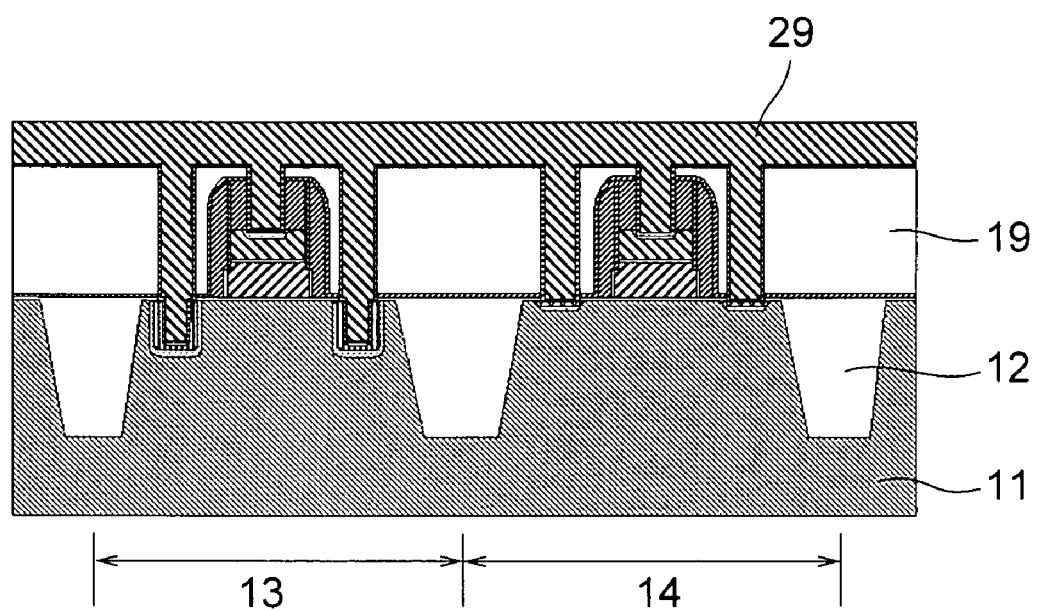
Figure 26:
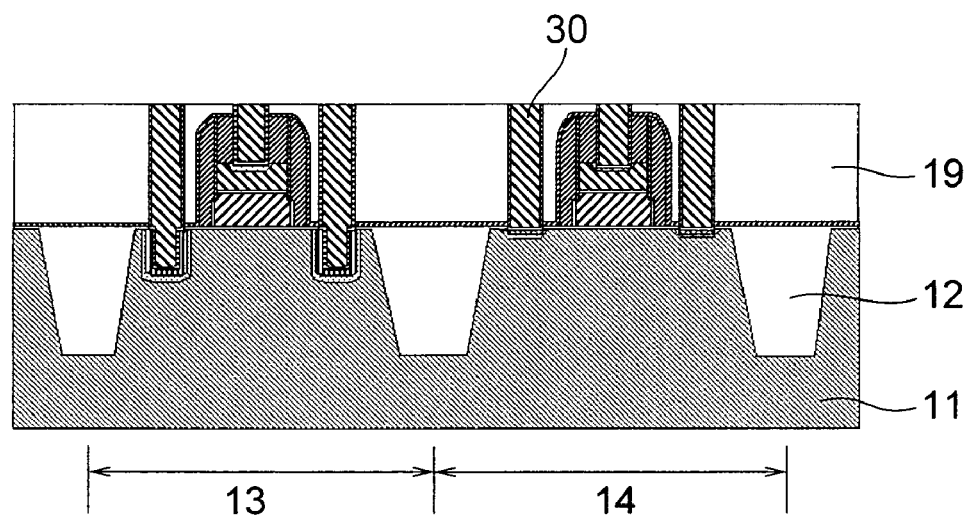

Subsequently, tungsten is deposited using a CVD process to form a W-CVD film 29 on the entire surface including the internal of the contact holes 20, 25 (FIG. 25). A portion of the W-CVD film 29, TiN film and Ti silicide layer on top of the interlayer dielectric film 19 is then removed using a CMP process, thereby leaving a tungsten plug 30 in the contact holes 20, 25 (FIG. 26). Thus, PMOS transistors in the peripheral circuit area of the DRAM device, and NMOS transistors in the memory cell area and peripheral circuit area of the DRAM device are obtained. Thereafter, a known process is conducted to form the overlying structure of the DRAM device.

The layout structure of the contact holes 20 and 25 in the present embodiment is similar to the layout structure of the contact holes in the first embodiment as described with respect to FIG. 12, for example. The elliptical contact holes 20, 25 extending parallel to the gate electrodes of the PMOS transistors provide a suitable compressive stress in the PMOS regions of the silicon substrate 11 and gate electrodes 20, 25. The layout structure of FIG. 13, if employed, can provide a controlled compressive strain in the gate electrodes 20, 25 and the silicon substrate in the vicinity thereof, thereby obtaining PMOS transistors having an improved ON-current.

The layout structure of FIG. 14, if employed, also provides PMOS transistors having an improved ON-current by controlling the number of circular holes 20B, 25B. Since the contact holes having the elliptical structure are not necessary for the NMOS transistors, contact holes 20B, 25B having a circular shape and contact holes 20, 25 having an elliptical shape may be employed for the NMOS transistors and PMOS transistors, respectively, in the peripheral circuit area, as shown in FIG. 15. In the present embodiment, the number of masks used in the photolithographic process is two, and not increased from the conventional technique in which the SiGe layer is not formed in a recess of the source/drain regions. The SiGe layer extending along the gate electrodes of the PMOS transistors and within the contact holes provides a suitable compressive stress in the silicon substrate in the vicinity of the gate electrodes, whereby the ON-current of the PMOS transistors can be improved.

Third Embodiment

Figure 27:
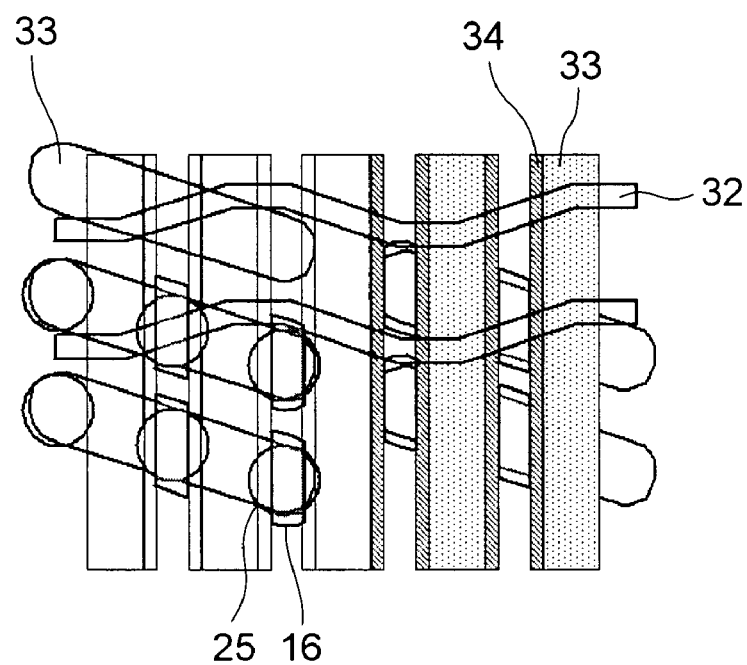
FIG. 27 is a top plan view of a memory cell array of a DRAM device having a 6F2 cell structure, to which the process of the first embodiment is applied.

The present invention is applicable to a DRAM device formed using a fine design rule to have a 6F2 cell layout structure. FIG. 27 shows a top plan view of the memory cell area of the DRAM device having the 6F2 cell layout structure. The distance between bit lines 32 is 3F, whereas the distance between the word lines or transistor gate lines 33 is 2F. On each active region 35, two word lines 33 extend having a LDD sidewall 34, a source region is formed between the two word lines 33, and two drain regions are formed outside of both the word lines 33. Contact holes 25 expose therethrough $N^+$-type diffused regions 16, which are formed using a selective epitaxial growth technique on the bottom of the contact holes 25. The word lines 33 and bit lines 32 extend to cross each other substantially at right angles, and are connected to the contact plugs formed within the contact holes 25 on the source regions. Each drain regions is connected to the bottom electrode of a cell capacitor not shown. The contact holes 25 connected to the source/drain regions have a circular shape, which is similar to the NMOS transistors in the peripheral circuit not shown. The contact holes of the PMOS transistors in the peripheral circuit area have an elliptical shape such as shown in FIG. 12.

It is preferable to adjust the depth of the SiGe layer by controlling the depth of the contact holes during the etching step shown in FIG. 2. Adjustment of the depth controls the location at which the compressive stress applies. It is to be noted that the depth of the contact holes is preferably such that the bottom of the contact holes is located below the bottom of the gate oxide film, and more preferably such that the top of the epitaxial layer deposited on the bottom of the contact holes is below the bottom of the gate oxide film. The elliptical shape of the contact holes in cross section supplies a uniform compressive strain to the gate electrodes and the source/drain regions in the vicinity thereof.

The configuration of the above embodiment may be preferably adopted in a DRAM device, and particularly in a DRAM device having a 6F2 cell layout structure.

While the invention has been particularly shown and described with reference to exemplary embodiment and modifications thereof, the invention is not limited to these embodiment and modifications. It will be understood by those of ordinary skill in the art that various changes in form and details may be made therein without departing from the spirit and scope of the present invention as defined in the claims.

What is claimed is:

1. A semiconductor device comprising:
   a silicon substrate;
   a PMOS transistor formed on said silicon substrate and including a source/drain region and a contact layer formed on said source/drain region;
   a dielectric film formed on said PMOS transistor and including therein a first contact hole penetrating said dielectric film, said contact layer, and a surface of said source/drain region of said PMOS transistor, the first contact hole having a bottom within the source/drain region;
   a germanium silicide film formed in said first contact hole and having a side formed on said contact layer and a bottom formed at the bottom of the first contact hole and in contact with said source/drain region of said PMOS transistor; and a first contact plug connecting to said germanium silicide film in said first contact hole.

2. The semiconductor device according to claim 1, wherein said first contact hole has a bottom located below a gate oxide film of said PMOS transistor.

3. The semiconductor device according to claim 2, further comprising:
an NMOS transistor formed on said silicon substrate; and
a second contact hole penetrating through said dielectric film to react a source/drain region of said NMOS transistor, said second contact hole having a bottom located above said bottom of said first contact hole.

4. The semiconductor device according to claim 3, wherein said first contact hole has an elliptical shape in cross section.

5. The semiconductor device according to claim 4, wherein said second contact hole has a circular shape in cross section.

6. The semiconductor device according to claim 3, wherein said first contact hole includes a plurality of elliptical holes arranged in a direction of major axis of said elliptical holes.

7. The semiconductor device according to claim 1, further comprising:
an NMOS transistor formed on said silicon substrate, said contact layer comprising an impurity-doped silicon film deposited by a selective epitaxial deposition process on said source/drain region of said PMOS transistor and a source/drain region of said NMOS transistor; and
a second contact plug formed in a second contact hole penetrating said dielectric film and connecting to said source/drain region of said NMOS transistor,
wherein said first contact hole penetrates said impurity-doped silicon layer to reach said source/drain region of said PMOS transistor.

8. The semiconductor device according to claim 7, wherein said germanium silicide film is in contact with said impurity-doped silicon film on a sidewall of said first contact hole.

9. A method for manufacturing a semiconductor device comprising:
forming a PMOS transistor and an NMOS transistor each including a source/drain region and a contact layer formed on said source/drain region;
forming a dielectric film covering said PMOS transistor and said NMOS transistor,
forming a first contact hole penetrating said dielectric film, said contact layer, and a surface of said source/drain region of said PMOS transistor, the first contact hole having a bottom within the source/drain region;
depositing germanium on said source/drain region of said PMOS transistor at the bottom of said first contact hole;
heat treating said deposited germanium to react with silicon in said source/drain region of said PMOS transistor and thereby form a germanium silicide film in said first contact hole and having a side formed on said contact layer and a bottom in contact with said source/drain region of said PMOS transistor; and
forming a first contact plug connecting to said germanium silicide film within said first contact hole.

10. The method according to claim 9, further comprising, prior to said forming said dielectric film:
forming said contact layer by selectively depositing an impurity-doped silicon film on said source/drain region of said PMOS transistor and said NMOS transistor.

11. The method according to claim 10, further comprising:
after said heat treating, forming a second contact hole penetrating said dielectric film to reach said impurity-doped silicon film formed on said source/drain region of said NMOS transistor.

12. The method according to claim 11, wherein said forming second contact hole also forms a gate contact hole exposing therethrough a gate electrode of said PMOS transistor and said NMOS transistor.

13. The method according to claim 11, wherein said first contact hole has an elliptical shape and said second contact hole has a circular shape.

14. The method according to claim 13, wherein said first contact hole includes a plurality of elliptical holes.

15. The semiconductor device according to claim 3, wherein a cross-sectional shape of the first contact hole is different than a cross-sectional shape of the second contact hole.

16. The semiconductor device according to claim 3, wherein the NMOS transistor comprises a contact layer formed on the source/drain region of the NMOS transistor, and
wherein the bottom of the second contact hole is defined by a surface of the contact layer.

17. The semiconductor device according to claim 16, wherein the contact layer of the PMOS transistor comprises a $P^+$ diffused contact region and the contact layer of the NMOS transistor comprises an $N^+$ diffused contact region.

18. A semiconductor device comprising:
a transistor formed on a silicon substrate and including a source/drain region and a contact layer formed on the source/drain region;
a dielectric film formed on the transistor, a contact hole being formed in the dielectric film, the contact layer, and a surface of the source/drain region of the transistor, the contact hole having a bottom within the source/drain region;
a germanium silicide film formed in the contact hole and including a side formed on the contact layer and a bottom formed at the bottom of the contact hole and in contact with the source/drain region of the transistor; and
a contact plug formed in the contact hole and connected to the germanium silicide film in the contact hole.

19. A semiconductor device comprising:
a transistor formed on a silicon substrate and including a source/drain region;
a dielectric film formed on the transistor, a contact hole being formed in the dielectric film and having a bottom within the source/drain region;
a germanium silicide film formed on an inner sidewall of the contact hole and including a bottom formed at the bottom of the contact hole and in contact with the source/drain region; and
a contact plug formed in the contact hole and connected to the germanium silicide film in the contact hole.

20. A method of manufacturing a semiconductor device comprising:
forming a transistor including a source/drain region on a silicon substrate;
forming a dielectric film on the transistor;
forming a contact hole in the dielectric film, the contact hole having a bottom within the source/drain region;
forming a germanium silicide film on an inner sidewall of the contact hole, the germanium silicide film having a bottom formed at the bottom of the contact hole and in contact with the source/drain region; and
forming a contact plug in contact with the silicide film within the contact hole.

* * * * *